United States Patent [19]

Sugiyama

[11] 4,259,724

[45] Mar. 31, 1981

[54] DEVICE COMPRISING A CIRCUIT FOR MAKING A BEAM EXPOSURE SYSTEM EFFECTIVELY DRAW A REPETITIVE PATTERN

[75] Inventor: Naoshi Sugiyama, Kawasaki, Japan

[73] Assignee: VLSI Technology Research Association, Kawasaki, Japan

[21] Appl. No.: 56,382

[22] Filed: Jul. 10, 1979

[30] Foreign Application Priority Data

Jul. 10, 1978 [JP] Japan .................................. 53-82887

[51] Int. Cl.³ ....................... G06F 15/46; A61K 27/02
[52] U.S. Cl. ................................. 364/491; 250/492 B
[58] Field of Search ... 364/489, 490, 491, 200 MS File, 364/900 MS File; 250/492 R, 492 A, 492 B; 29/569 R, 571, 574, 576 B, 577 R, 577 C, 584

[56] References Cited

U.S. PATENT DOCUMENTS

| | | | |
|---|---|---|---|
| 3,866,013 | 2/1975 | Ryan | 250/492 A |
| 3,875,416 | 4/1975 | Spicer | 250/492 A |
| 4,117,340 | 9/1978 | Goto et al. | 250/492 A |
| 4,132,898 | 1/1979 | Buelow et al. | 250/492 B X |
| 4,151,421 | 4/1979 | Sumi | 250/492 R X |

*Primary Examiner*—Joseph F. Ruggiero
*Attorney, Agent, or Firm*—Sughrue, Rothwell, Mion, Zinn and Macpeak

[57] ABSTRACT

Patterns to be drawn by a controlled electron beam producing system or a like system, as on a mask for integrated circuits, are classified into nonrepetitive and repetitive patterns. Each repetitive pattern is specified by those coordinates of an elementary pattern and those displacement and numbers of repetition of the elementary pattern which are stored in a data file as are the cases with coordinates of nonrepetitive patterns. In addition to a first register group for each of nonrepetitive patterns, a device for controlling production of the beam comprises a second register group for the data supplied thereto by accessing the data file only once for each repetitive pattern. A sequence controller repeatedly reads the coordinates of the elementary pattern from the register group, with the coordinates varied according to the displacements also read therefrom a plurality of times determined by those numbers of repetition which are also read therefrom.

1 Claim, 5 Drawing Figures

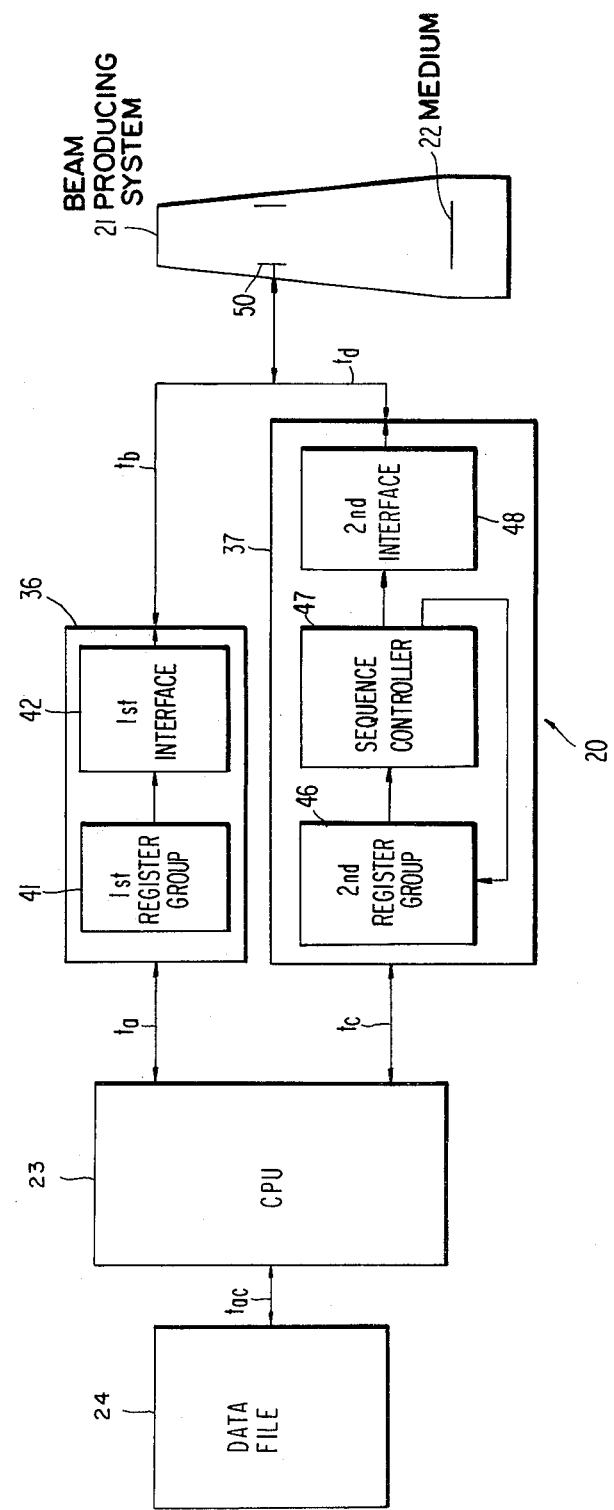

DEVICE COMPRISING A CIRCUIT FOR MAKING A BEAM EXPOSURE SYSTEM EFFECTIVELY DRAW A REPETITIVE PATTERN

BACKGROUND OF THE INVENTION

This invention relates to a device for controlling a system for producing a controlled beam of particles, such as a system known as an electron beam exposure system.

It is known in the art that an electron beam exposure system enables minute patterns to be drawn by the use of an electron beam on a medium, as compared with an optical exposure system. With miniaturization of an integrated circuit, the electron beam exposure system tends to be adopted in lieu of the optical exposure system to fabricate various masks required on production of the integrated circuit. In general, the electron beam exposure system comprises a beam producing system for producing a controlled electron beam to draw a pattern on the medium, a control interface device for controlling the controlled electron beam, and a data file coupled to the control interface device for memorizing a plurality of data set specifying various patterns to be drawn by the electron beam.

In a conventional electron beam exposure system, a data set for a single pattern is supplied from the data file to the control interface device each time when the single pattern is drawn by an electron beam. After the single pattern is drawn, the data file memory supplies the next following data set for another single pattern to the control interface device. On the other hand, a great number of patterns are usually required to fabricate the integrated circuit, especially, a very large scale integrated circuit. The data file memory must, therefore, be accessed many times. As a result, it takes a long time with the conventional system to draw all of the patterns.

SUMMARY OF THE INVENTION

It is to be noted here that patterns to be drawn by a beam exposure system are classified into nonrepetitive and repetitive patterns.

It is an object of the present invention to provide a device for making a beam exposure system effectively operate for repetitive patterns.

A device to which this invention is applicable is used together with a system responsive to a beam control signal representative of a selected one of repetitive and nonrepetitive patterns for producing a controlled beam of particles to draw the pattern on a medium sensitive to said beam. Each of the repetitive patterns comprises an elementary pattern repeatedly arranged according to a law of repetition. The nonrepetitive patterns are different from said repetitive patterns. The device according to this invention comprises first memory means for memorizing data sets of a first kind representing the nonrepetitive patterns, respectively, first reading means coupled to said first memory means for reading one of the data sets of the first kind that represents the selected nonrepetitive pattern, the first reading means thereby producing, as the beam control signal, a first sequence of data signals representative of the read-out data set of the first kind, second memory means for memorizing data sets of a second kind representing the elementary patterns of the repetitive patterns, respectively, and data sets of a third kind corresponding to the respective data sets of the second kind and representing the respective laws of repetition, and second reading means coupled to the second memory means for reading one of the data sets of the second kind and the corresponding data set of the third kind, the read-out data set of the second kind representing the elementary pattern that the selected repetitive pattern comprises, the read-out data set of the third kind representing that law of repetition according to which the elementary pattern represented by the read-out data set of the second kind is repeatedly arranged, the second reading means thereby producing, as the beam control signal, a second sequence of data signals representative of the read-out data set of the second kind repeatedly arranged according to the law of repetition represented by the read-out data set of the third kind.

BRIEF DESCRIPTION OF THE DRAWING

FIG. 3 is a block diagram of an electron beam exposure system comprising a beam control device according to an embodiment of this invention;

DESCRIPTION OF THE PREFERRED EMBODIMENTS

Figure 1:
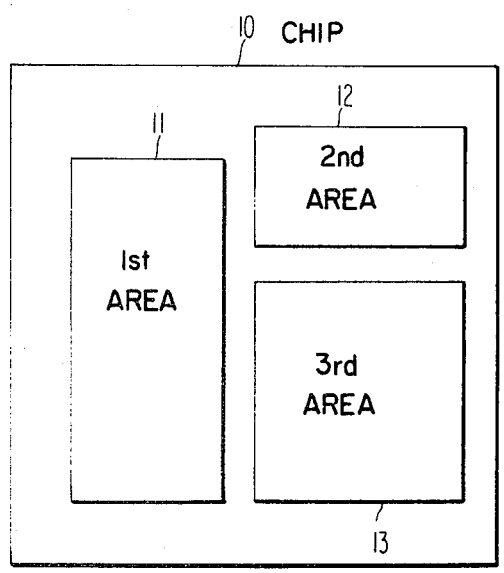
FIG. 1 is a schematic top view of a single chip.

Referring to FIG. 1, a single chip 10 is schematically exemplified for a better understanding of this invention. The chip 10 is one of a plurality of similar chips arranged on a wafer (not shown). Merely by way of example, let the chip 10 be for use as a memory device. The chip 10 has a first area 11 for a multiplicity of read-only memory cells, a second area 12 for a great number of random access memory cells, and a third area 13 for a control circuit for the memory cells. In each of the first, second, and third areas 11, 12, and 13, one or more patterns (not shown) are drawn by the use of an electron beam. The patterns are selected from nonrepetitive patterns and repetitive patterns. Each repetitive pattern comprises an elementary or common pattern repeatedly arranged according to a law of repetition as will later be described. The nonrepetitive patterns are different from the repetitive patterns. The patterns drawn on the first and the second areas 11 and 12 are repetitive patterns. Those drawn on the third area 13 are mainly nonrepetitive patterns.

Figure 2:
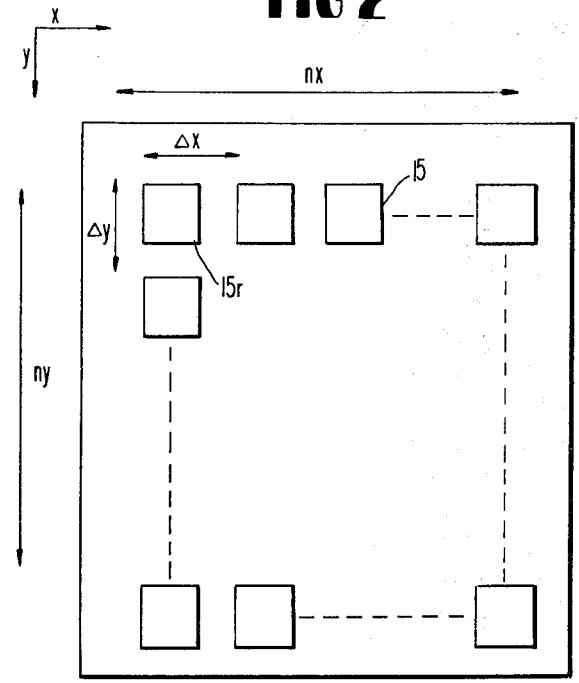
FIG. 2 is an enlarged view of a repetitive pattern drawn in the chip illustrated in FIG. 1.

Referring to FIG. 2, a repetitive pattern on either of the first and the second areas 11 and 12 comprises a rectangular pattern 15 as the elementary pattern. The rectangular pattern 15 is repeated in columns and rows. Although a rectangular pattern is exemplified, the elementary pattern may consist of a plurality of fractional patterns. At any rate, it is possible to define repetitive patterns by giving coordinates of various points selected thereon with reference to orthogonal coordinate axes x and y. For convenience of description, the elementary pattern in the leftmost column and the uppermost row is called a reference pattern $15r$. Let the coordinates of the reference pattern $15r$ be given by $(x_1, y_1)$, $(x_2, y_2)$, ..., and $(x_m, y_m)$. For example, a rectangular reference pattern $15r$ is defined by the coordinates $(x_1, y_1)$ through $(x_4, y_4)$ of four corner points. In the illustrated example, the rectangular pattern 15 is repeated $n_x$ and $n_y$ times along the x and the y axes, respectively. In other words, similar rectangular patterns, equal in number to $n_x$ and $n_y$, are arranged along each row and each column. Let displacements of the similar patterns along the row and the column be represented by $\Delta x$ and $\Delta y$, respectively. The numbers $n_x$ and $n_y$ and the displacements $\Delta x$ and $\Delta y$ define a law of repetition.

Referring to FIG. 3, a device 20 according to a first embodiment of this invention is for use in combination with a beam production system 21 for producing a controlled electron beam to expose a medium 22, such as the above-exemplified wafer, to the beam and to thereby draw a selected one of repetitive and nonrepetitive patterns on the medium at a time. The medium 22 should be sensitive to the electron beam. The device 20 is for supplying the beam production system 21 with a beam control signal representative of the selected pattern. The device 20 is coupled to an electronic digital computer 25 comprising a central processor 26 and a data file 27 to form an electron beam exposure system. The data file 27 memorizes a plurality of first data sets of a first kind representing the respective nonrepetitive patterns to be drawn on chips of various wafers. Each of the first data sets may include a command data indicative of a nonrepetitive pattern. These first data sets will not be described any further because they are substantially equal to known data sets. The data file 27 further memorizes data sets of a group relating to the repetitive patterns to be drawn on various chips.

Figure 4:
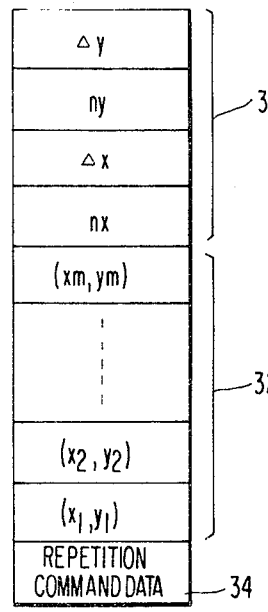
FIG. 4 shows a data set for a repetitive pattern.

Referring to FIGS. 2 and 3 again and FIG. 4 afresh, the data group comprises a plurality of data sets of a second kind and data sets of a third kind corresponding to the respective data sets of the second kind. One of the second-kind data sets and a corresponding one of the third-kind data sets cooperate to represent a repetitive pattern. Each of the second-kind data sets 32 is representative of the coordinate of the reference pattern 15r to specify the elementary pattern. A third-kind data set 33 corresponding to the second-kind data set 32 represents the law of repetition given by the numbers $n_x$ and $n_y$ and the displacements $\Delta x$ and $\Delta y$. The second-kind and the third-kind data sets 32 and 33 are further accompanied by a repetition command data 34 that is used as an index to the repetition pattern represented by the illustrated data sets 32 and 33.

Referring back to FIG. 3, the device 20 comprises first and second generator sections 36 and 37. For a certain pattern to be drawn on a particular chip, the central processor 26 selects one of the data sets of the first kind and the data sets of the group from the data file 27. When the read-out data set includes no repetition command data exemplified at 34, the processor 26 delivers the read-out data set to the first generator section 36. When a repetition command data is found, the processor 26 sends the read-out data set to the second generator section 37. The first generator section 36 comprises a first register group 41 for retaining the read-out data set and a first interface circuit 42 responsive to the retained data set for producing a first sequence of data signals. The second generator section 37 comprises a second register group 46 for retaining the read-out data set, a sequence controller 47 for processing the retained data set into a sequence of processed data, and a second interface circuit 48 responsive to the processed data sequence for producing a second sequence of data signals. The beam producing system 21 comprises a beam deflecting means 50. Data signals of one of the first and the second sequences that is determined by the processor 26 is supplied to the beam deflecting means as the beam control signal. After the selected pattern is drawn on the medium 22, the beam producing system 21 sends a completion signal back towards the processor 26. Each of the interface circuits 42 and 48 comprises a gate (not shown) enabled only when a pertinent one of the first and the second generator sections 36 and 37 is in operation. The completion signal is thus supplied to the processor 26 to enable the same select another of the repetitive and the nonrepetitive patterns.

Figure 5:
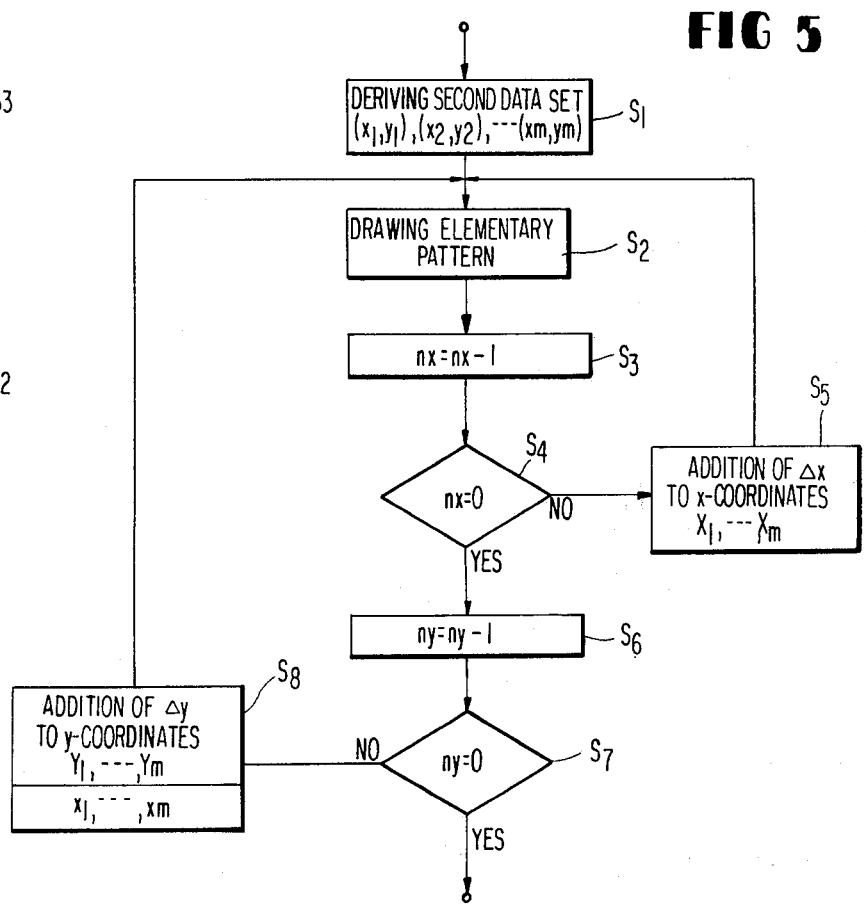
FIG. 5 is a flow chart for use in describing a process according to which a repetitive pattern is drawn from the data set exemplified in FIG. 4.

Referring now to FIG. 5 in addition to FIGS. 2 through 4, let it be assumed that the second register group 46 retains one of the data sets of the group. The retained data set comprises a second-kind data set, a third-kind data set, and a repetition command data as exemplified in FIG. 4 at 32, 33, and 34, respectively. The sequence controller 47 monitors whether or not a repetition command data is retained in the register group 46. When a repetition command data is found, the controller 47 is put into operation. Having found the repetition command data 30 depicted in FIG. 4, the controller 47 makes the register group 46 deliver the second-kind data set 31 to the controller 47 as indicated in a first stage $S_1$. The controller 47 produces a first partial sequence of position signals representative of the coordinates $(x_1, y_1), (x_2, y_2), \ldots,$ and $(x_m, y_m)$. The second interface circuit 48 produces a first partial sequence of data signals for making the beam producing system 21 draw the reference pattern 15r on the medium 22 as shown in a second stage $S_2$. As soon as the reference pattern 15r is drawn, the system 21 supplies a first completion signal back to the controller 47. Responsive thereto, the controller 47 makes the register group 46 produce a first data of the third-kind data set 33, namely, the number $n_x$. The controller 42 subtracts unity from the number $n_x$ as designated in a third stage $S_3$ and checks whether or not the result of subtraction, $n_x - 1$, is equal to zero as depicted in a fourth stage $S_4$. If not, the controller 47 makes the register group 46 produce a second data of the third-kind data set, namely, the displacement $\Delta x$, and adds the displacement $\Delta x$ to the second-kind data set as shown in a fifth stage $S_5$. As a result, the controller 47 produces a second partial sequence of position signals representative of coordinates $(x_1 + \Delta x, y_1), (x_2 + \Delta x, y_2), \ldots,$ and $(x_m + \Delta x, y_m)$. The interface circuit 48 produces a second partial sequence of data signals to make the system 21 draw an elementary pattern that is arranged on the right side of the reference pattern 15r as depicted in the second stage $S_2$.

The stages $S_2$ through $S_5$ are repeated until the result of subtraction is rendered zero, when the controller 47 makes the register group 46 produce a third data of the third-kind data set, namely, the number $n_y$, and subtracts unity from the number $n_y$ as indicated in a sixth stage $S_6$. Confirming that the result of subtraction is not equal zero, the controller 47 makes the register group 46 produce a fourth data of the third-kind data set, that is, the displacement $\Delta y$. The controller 47 adds the displacement $\Delta y$ to the second-kind data set representative of the reference pattern 15r as shown in an eighth stage $S_8$. The interface circuit 48 produces a partial sequence of position signals representative of coordinates $(x_1, y_1 + \Delta y), (x_2, y_2 + \Delta y), \ldots,$ and $(x_m, y_m + \Delta y)$. A stage next following the second stage $S_2$ for the position signals $(x_1, y_1 + \Delta y)$ and so on is the third through the fifth stages $S_3$ to $S_5$.

When the result of subtraction $n_x-1$ is found again to be zero, the controller 47 subtracts unity from the previously calculated result of subtraction $n_y-1$. Having thus successively drawn all elementary patterns, such as 15, of the repetitive pattern, the system 21 produces an $(n_x \cdot n_y)$-th completion signal, which is sent back to the processor 26. It is now understood that the data file 24 is accessed only once during production of the controlled beam for the whole repetitive pattern. This considerably speeds up drawing a repetitive pattern.

Referring again to FIG. 3, let it be assumed that intervals of time $t_a$, $t_b$, $t_c$, $t_d$, and $t_{ac}$ are necessary for signals to be transferred between the central processor 26 and the first register group 41, between the first interface circuit 42 and the beam producing system 21, between the processor 26 and the second register group 46, between the second interface circuit 48 and the beam producing system 21, and between the processor 26 and the data file 27, respectively. A conventional system does not comprise the second generator section 32. A total time of $n_x n_y(t_{ac}+2t_a+2t_b)$ is therefore necessary for transfer of the signals between the parts 26, 27, 46, 47, and 21 on drawing a repetitive pattern exemplified with reference to FIGS. 2 and 4. In contrast, the corresponding time is only $t_{ac}+2t_c+2n_x n_y t_d$. The difference is equal to:

$$(n_x n_y - 1)(t_{ac}+2t_a),$$

when $t_a$ and $t_b$ are equal to $t_c$ and $t_d$, respectively.

In practice, the number of elementary patterns in each chip amounts to as many as $10^6$. A wafer comprises about one hundred chips. The time $t_{ac}+2t_a$ is about ten microseconds. The difference therefore amounts to one thousand seconds. As a result, it is possible with a device according to this invention to draw repetitive patterns on a wafer about 16 to 19 minutes faster.

While this invention has so far been described in conjunction with an embodiment thereof, it is readily possible for those skilled in the art to put the invention into practice in various manners. For example, this invention is applicable to an etching system and a system using a neutron beam. In addition, the system may comprise more than two generator sections of the type of the second generator section 37.

What is claimed is:

1. A device for use in combination with a system responsive to a beam control signal representative of a selected one of repetitive and nonrepetitive patterns for producing a controlled beam of particles to draw said pattern on a medium sensitive to said beam, each of said repetitive patterns comprising an elementary pattern repeatedly arranged according to a law of repetition, said nonrepetitive patterns being different from said repetitive patterns, said device comprising:

first memory means for memorizing data sets of a first kind representing said nonrepetitive patterns, respectively;

first reading means coupled to said first memory means for reading one of the data sets of said first kind that represents the selected nonrepetitive pattern, said first reading means thereby producing, as said beam control signal, a first sequence of data signals representative of the read-out data set of said first kind;

second memory means for memorizing data sets of a second kind representing the elementary patterns of said repetitive patterns, respectively, and data sets of a third kind corresponding to the respective data sets of said second kind and representing the respective laws of repetition; and second reading means coupled to said second memory means for reading one of the data sets of said second kind and the corresponding data set of said third kind, the read-out data set of said second kind representing the elementary pattern that the selected repetitive pattern comprises, the read-out data set of said third kind representing that law of repetition according to which the elementary pattern represented by the read-out data set of said second kind is repeatedly arranged, said second reading means thereby producing, as said beam control signal, a second sequence of data signals representative of the read-out data set of said second kind repeatedly arranged according to the law of repetition represented by the read-out data set of said third kind.

* * * * *